(12) United States Patent
Chou et al.

(10) Patent No.: US 11,953,947 B2
(45) Date of Patent: Apr. 9, 2024

(54) FLASH DRIVE

(71) Applicant: New Concepts Development Corporation, Woodstock, IL (US)

(72) Inventors: Wen-chien Chou, Woodstock, IL (US); Tal Volk, Woodstock, IL (US)

(73) Assignee: NEW CONCEPTS DEVELOPMENT CORPORATION, Woodstock, IL (US)

(*) Notice: Subject to any disclaimer, the term of this patent is extended or adjusted under 35 U.S.C. 154(b) by 511 days.

(21) Appl. No.: 17/359,301

(22) Filed: Jun. 25, 2021

(65) Prior Publication Data

US 2022/0413559 A1 Dec. 29, 2022

(51) Int. Cl.
*G06F 13/38* (2006.01)
*G06F 1/16* (2006.01)

(52) U.S. Cl.
CPC .......... *G06F 1/1679* (2013.01); *G06F 1/1681* (2013.01); *G06F 1/1684* (2013.01); *G06F 13/385* (2013.01); *G06F 2213/0042* (2013.01)

(58) Field of Classification Search
CPC .... G06F 1/1679; G06F 1/1681; G06F 1/1684; G06F 13/385; G06F 13/387; G06F 2213/0042
USPC ........... 361/679.31, 679.32; 710/64, 74, 301, 710/302; 711/103
See application file for complete search history.

(56) References Cited

U.S. PATENT DOCUMENTS

2014/0281139 A1* 9/2014 Smurthwaite ........ H05K 5/0278
361/679.32
2018/0046421 A1* 2/2018 Mazurek ............. G06F 12/0246

FOREIGN PATENT DOCUMENTS

| CN | 206400598 U | * | 8/2017 |
| CN | 206820215 U | * | 12/2017 |
| KR | 20150089652 A | * | 8/2015 |
| TW | 201807536 A | * | 3/2018 |
| TW | M616957 U | * | 9/2021 |

* cited by examiner

*Primary Examiner* — Ilwoo Park
(74) *Attorney, Agent, or Firm* — Ladas & Parry, LLP

(57) ABSTRACT

A flash drive includes a main housing, a USB adapter unit mounted in the main housing and extending out of the main housing, an inner housing movably connected to the main housing, and a flash memory unit including a flash memory that is mounted in the inner housing, and a USB-A plug that is connected to the flash memory. The inner housing is operable to move, with respect to the main housing, between a USB-C position, where the USB-A plug is electrically connected to the USB adapter unit to allow for data transfer therebetween, and a USB-A position, where the USB-A plug is detached from the USB adapter unit to prevent data transfer therebetween, such that data is transferable to and from the flash memory via the USB-A plug.

5 Claims, 5 Drawing Sheets

FLASH DRIVE

FIELD

The disclosure relates to a flash drive, and more particularly to a flash drive having an embedded USB adapter.

BACKGROUND

A conventional flash drive typically includes a flash memory chip that is disposed in a protective housing, and that is operably connected to a universal serial bus (USB) plug connector (e.g., a USB type-A plug) extending out from an end of the housing.

With USB type-C ports becoming more prevalent on the market, users often need to have a type-A to type-C adapter at hand in order to use the conventional flash drive with a type-A plug to perform data transfer among different host devices (e.g., from a computer with type-A port to a computer with type-C port), which can be rather inconvenient. Moreover, the adapter can be easily misplaced and lost over time due to its small size.

SUMMARY

Therefore, the object of the disclosure is to provide a flash drive embedded with a USB adapter unit that can alleviate the drawback of the prior art.

According to the disclosure, a flash drive includes a main housing, a USB adapter unit, an inner housing and a flash memory unit.

The main housing defines a receiving space. The USB adapter unit includes an adapter component that is mounted in the receiving space, and a USB-C plug that is electrically connected to the adapter component, and that extends out of a first end of the main housing. The inner housing is received in the receiving space, and is movably connected to the main housing. The flash memory unit includes a flash memory that is configured for data storage, and that is co-movably mounted in the inner housing, and a USB-A plug that is electrically connected to the flash memory.

The inner housing is operable to move, with respect to the main housing, between a USB-C position, where the USB-A plug is electrically connected to the adapter component to allow for data transfer between the flash memory unit and the USB adapter unit, and a USB-A position, where the USB-A plug is detached from the adapter component and extends out of a second end of the main housing which is opposite to the first end of the main housing to prevent data transfer between the flash memory unit and the USB adapter unit.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
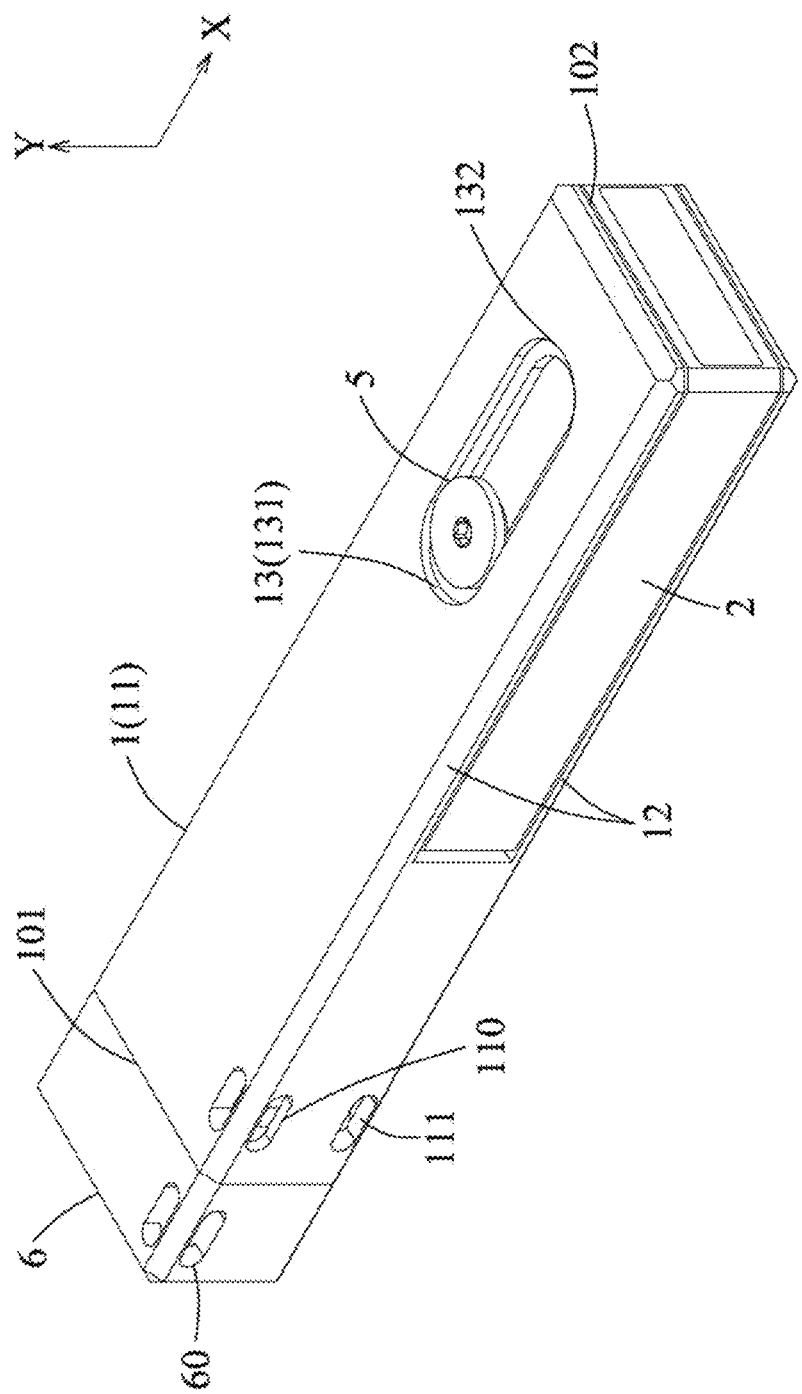
FIG. 1 is an assembled perspective view of an embodiment of a flash drive according to the disclosure.
Figure 2:
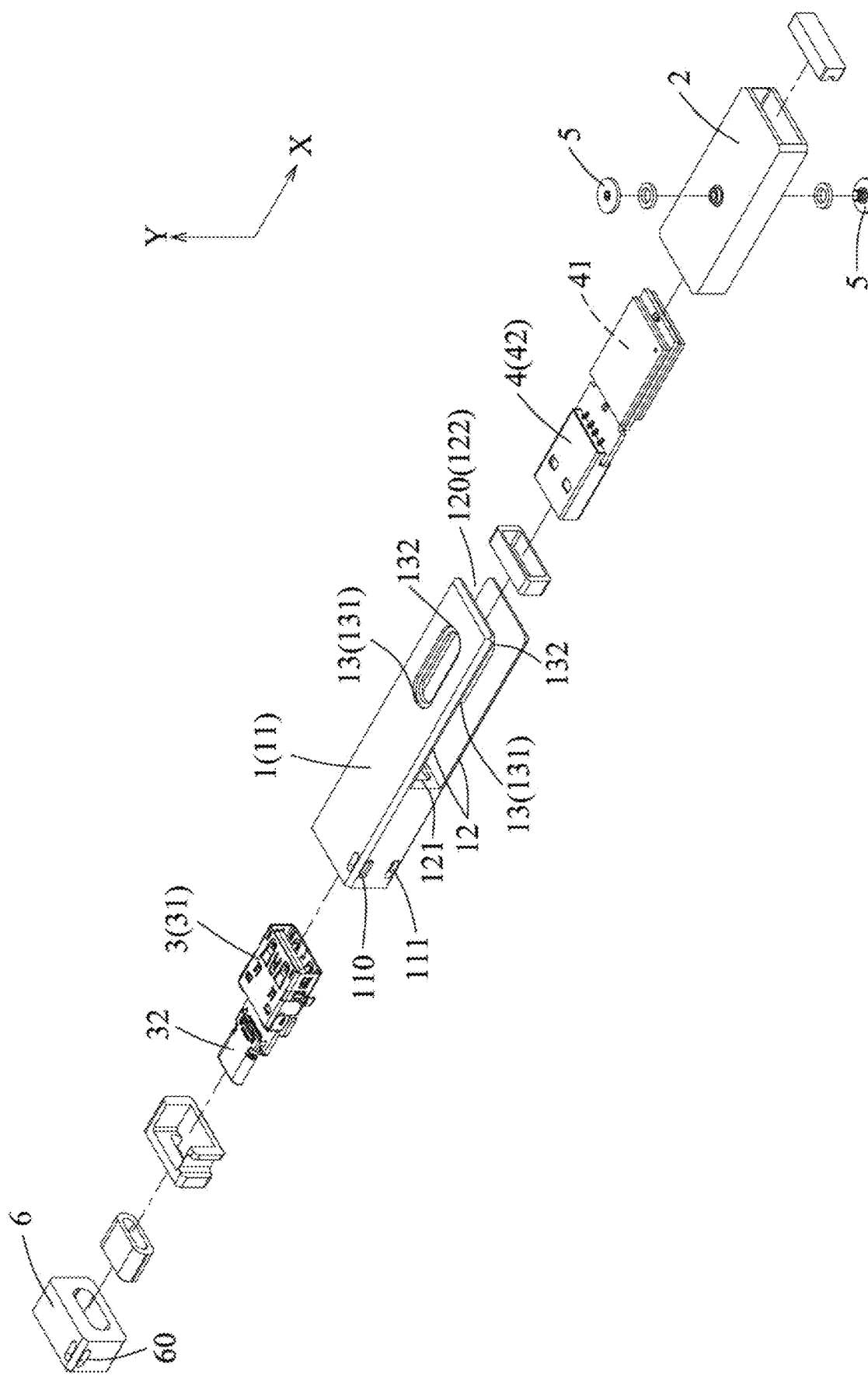
FIG. 2 is an exploded perspective view of the embodiment.
Figure 3:
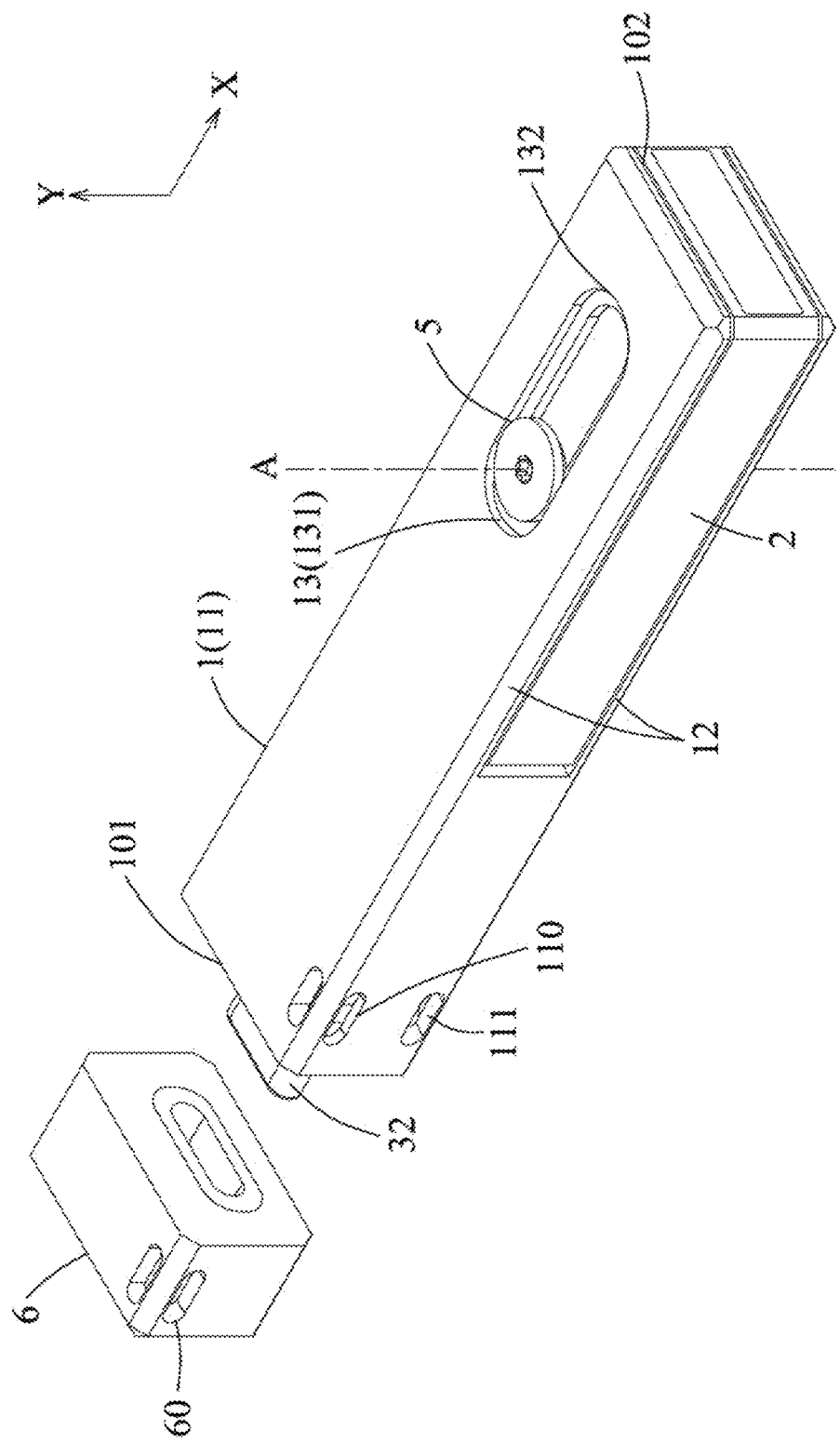
FIG. 3 is a partly exploded perspective view of the embodiment, illustrating an inner housing at a USB-C position.

Referring to FIGS. 1, 2 and 3, an embodiment of a flash drive is adapted to be connected to a host device (not shown), such as a personal computer (PC), and includes a main housing 1, an inner housing 2, a USB adapter unit 3, a flash memory unit 4, two engaging members 5 and a protecting cap 6.

The main housing 1 has a housing portion 11, and two extending portions 12 that extend parallelly from the housing portion 11 in a first direction (X), that are spaced apart from each other in a second direction (Y) transverse to the first direction (x), and that cooperate with the housing portion 11 to define a receiving space 120.

Specifically, the receiving space 120 has a first receiving section 121 (see FIG. 2) and a second receiving section 122 that are arranged in the first direction (X). The first receiving section 121 of the receiving space 120 is surrounded by the housing portion 11 of the main housing 1, and the second receiving section 122 of the receiving space 120 is disposed between the extending portions 12 of the main housing 1.

Each of the extending portions 12 of the main housing 1 is formed with an elongated slot 13 that is spatially communicated with the second receiving section 122 of the receiving space 120, that is elongated in the first direction (X), and that has first and second slot ends 131, 132 being opposite to each other in the first direction (X), and being respectively proximate to and distal from the housing portion 11.

The USB adapter unit 3 is connected to the housing portion 11 of the main housing 1, and includes an adapter component 31 that is mounted in the first receiving section 121 of the receiving space 120, and a USB-C plug 32 that is electrically connected to the adapter component 31. The main housing 1 further has a first end 101 and a second end 102 that are opposite to each other in the first direction (x), and that are respectively disposed on the housing portion 11 and one of the extending portions 12. The USB-C plug 32 extends from the housing portion 11 out of the first end 101 of the main housing 1.

The inner housing 2 is received in the second receiving section 122 of the receiving space 120, and is movably connected to the main housing 1 through the engaging members 5.

Specifically, the engaging members 5 are spaced apart from each other in the second direction (Y), are engaged respectively with the elongated slots 13 of the extending portions 12 of the main housing 1, and are connected to the inner housing 2. Each of the engaging members 5 is movable between the first and second slot ends 131, 132 of the elongated slot 13 of a respective one of the extending portions 12, and is rotatable about a rotational axis (A) (see FIG. 4) that extends in the second direction (Y) so as to result in linear and rotational motions of the inner housing 2 with respect to the main housing 1. In the present embodiment, each of the engaging members 5 is a screw that is threadedly connected to the inner housing 2, and the inner housing 2 is prevented from becoming detached from the main housing 1.

The flash memory unit 4 includes a flash memory 41 that is configured for data storage, and that is co-movably mounted in the inner housing 2, and a USB-A plug 42 that is electrically connected to the flash memory 41, and that extends out of an end of the inner housing 2.

The protecting cap 6 removably covers a portion of the USB-C plug 32 that is exposed from the housing portion 11 of the main housing 1 to protect the USB-C plug 32, and is formed with an engaging hole 60. The housing portion 11 of the main housing 1 is also formed with an engaging hole 110. The two engaging holes 110, 60 of the housing portion 11 and the protecting cap 6 are adapted to be engaged with a flexible component (e.g., a cord) such that the main housing 1 and the protecting cap 6 are connected thereby, and that the protecting cap 6 is prevented from being misplaced and lost during use. The housing portion 11 of the main housing 1 is further formed with a keychain hole 111 that is spaced apart from the engaging hole 110 and that is adapted for a keychain or a cord to pass therethrough. It should be noted that, in variations of the embodiment, the engaging holes 110, 60 may be omitted and the protecting cap 6, the flexible component and the main housing 1 may be integrally formed as one piece to provide the same function.

Figure 4:
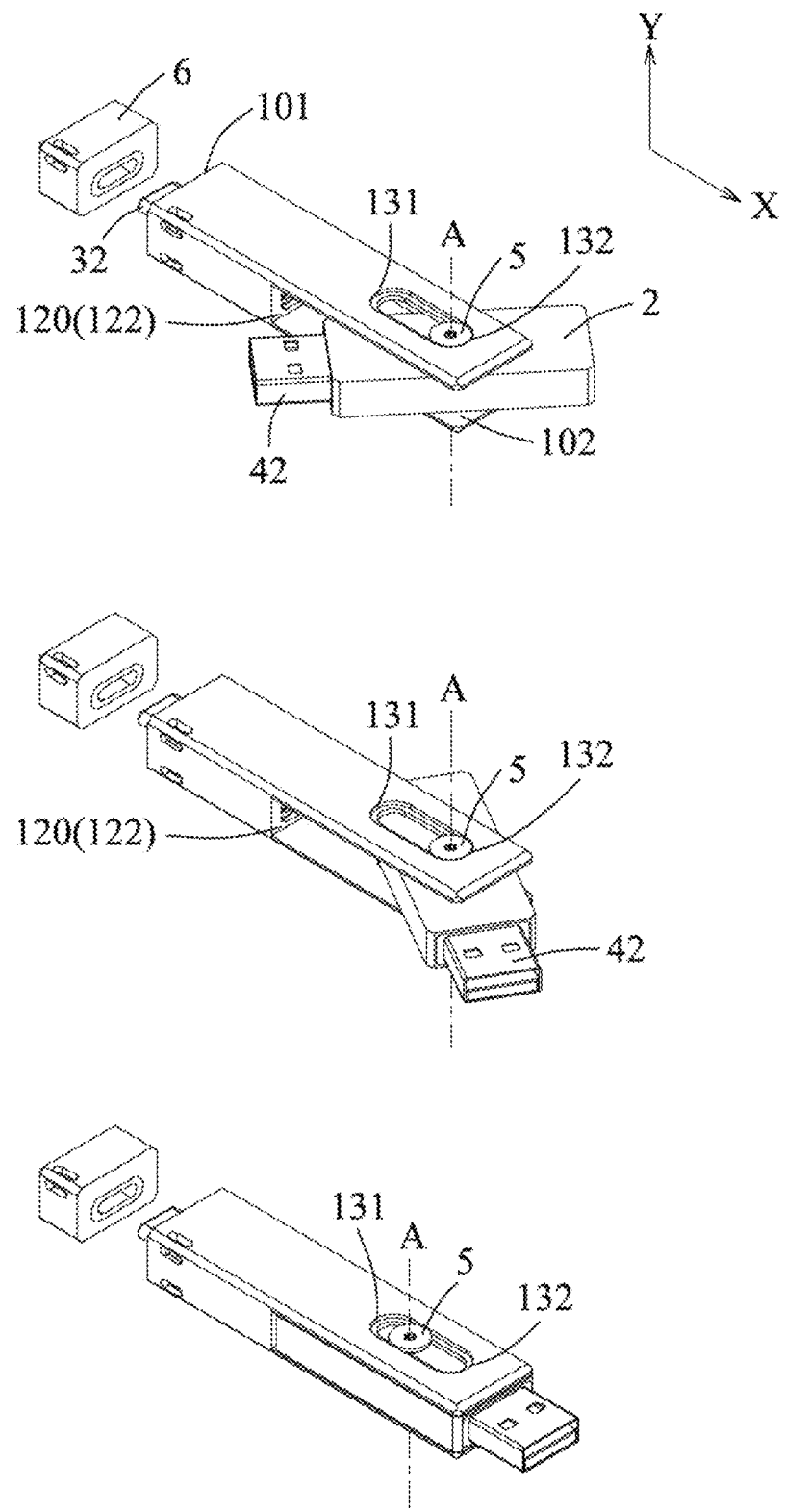
FIG. 4 is a perspective view illustrating the inner housing moving from the USB-C position to a USB-A position.
Figure 5:
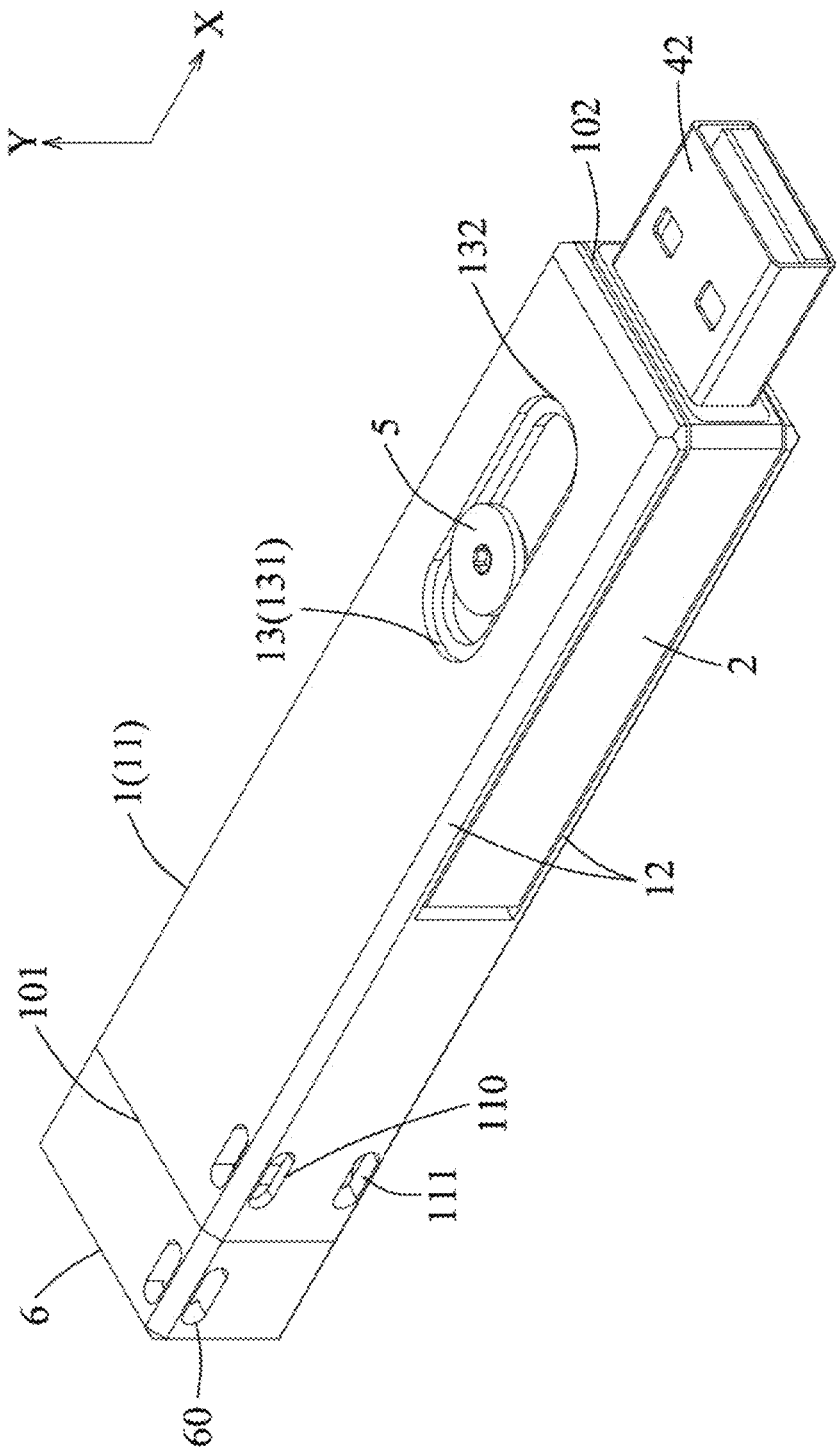
FIG. 5 is a perspective view of the embodiment, illustrating the inner housing at the USB-A position.

Referring to FIGS. 3, 4 and 5, when the flash drive is in use, the inner housing 2 is operable to move, with respect to the main housing 1, between a USB-C position (see FIG. 3) and a USB-A position (see FIG. 5).

When the inner housing 2 is at the USB-C position, the USB-A plug 42 of the flash memory unit 4 is electrically connected to the adapter component 31 of the USB adapter unit 3 to allow for data transfer between the flash memory unit 4 and the USB adapter unit 3.

When being moved from the USB-C position to the USB-A position, the inner housing 2 is first pulled away from the housing portion 11 of the main housing 1 (meanwhile, the USB-A plug 42 is detached from the adapter component 31), such that each of the engaging members 5 moves from the first slot end 131 towards the second slot end 132 of the elongated slot 130 of the respective one of the extending portions 12. Next, the inner housing 2 is rotated 180 degrees in either directions (i.e., clockwise or counterclockwise) about the rotational axis (A) relative to the main housing 1, and then pushed towards the housing portion 11 of the main housing; that is, each of the engaging members 5 moves from the second slot end 132 towards the first slot end 131 of the elongated slot 130 of the respective one of the extending portions 12 (see the bottom drawing of FIG. 4).

As such, when the inner housing 2 is at the USB-A position, the USB-A plug 42 of the flash memory unit 4 is detached from the adapter component 31 and extends out of the second end 102 of the main housing 1 to prevent data transfer between the flash memory unit 4 and the USB adapter unit 3.

It should be noted that, in a variation of the embodiment, the flash drive may further include a locking mechanism that is disposed in the receiving space 120 of the main housing 1, and that is configured to lock the inner housing 2 in the USB-A position with respect to the main housing 1 to prevent undesired movement therebetween. In another variation of the embodiment, two side surfaces of the inner housing 2 that are opposite to each other in a third direction perpendicular to both the first and second directions (X, Y) may have an uneven surface texture (e.g., a knurled texture) to provide a better gripping effect.

In summary, benefits of the present embodiment according to the disclosure are as follows.

By virtue of having the embedded USB adapter unit 3, a user can easily perform data transfer among different host devices using the flash drive of the present embodiment without the need of a separate USB-A to USB-C adapter. In addition, the elongated slot design of the embodiment provides the user with an easy and convenient means to switch the flash drive between two output plugs (i.e., USB-A plug and USB-C plug) to adapt to different host devices.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A flash drive comprising:
    a main housing that defines a receiving space;
    a USB adapter unit that includes
        an adapter component mounted in said receiving space, and
        a USB-C plug electrically connected to said adapter component, and extending out of a first end of said main housing;
    an inner housing that is received in said receiving space, and that is movably connected to said main housing; and
    a flash memory unit that includes
        a flash memory configured for data storage, and co-movably mounted in said inner housing; and
        a USB-A plug electrically connected to said flash memory;
    wherein said inner housing is operable to move, with respect to said main housing, between
        a USB-C position, where said USB-A plug is electrically connected to said adapter component to allow for data transfer between said flash memory unit and said USB adapter unit, and
        a USB-A position, where said USB-A plug is detached from said adapter component and extends out of a second end of said main housing which is opposite to said first end of said main housing to prevent data transfer between said flash memory unit and said USB adapter unit.

2. The flash drive as claimed in claim 1, wherein:
    said main housing has
        a housing portion, and
        two extending portions extending parallelly from said housing portion in a first direction, spaced apart from each other in a second direction transverse to the first direction, and cooperating with said housing portion to define said receiving space, said USB adapter unit being connected to said housing portion of said main housing, each of said extending portions being formed with an elongated slot that is spatially communicated with said receiving space, that is elongated in the first direction, and that has first and second ends being opposite to each other in the first direction; and said flash drive further comprises at least one engaging member engaged with said elongated slot of one of said extending portions of said main housing, connected to said inner housing, being movable between said first and second ends of said elongated slot of the one of said extending portions, and being rotatable about a rotational axis that extends in the second direction so as to result in linear and rotational motions of said inner housing with respect to said main housing.

3. The flash drive as claimed in claim 2, wherein:

said at least one engaging member includes two engaging members that are spaced apart from each other in the second direction, and that are engaged respectively with said elongated slots of said extending portions of said main housing; and each of said engaging members is movable between said first and second ends of said elongated slot of the respective one of said extending portions, and is rotatable about the rotational axis.

4. The flash drive as claimed in claim 3, wherein each of said engaging members is a screw that is threadedly connected to said inner housing.

5. The flash drive as claimed in claim 1, wherein said flash drive further comprises a protecting cap that removably covers a portion of said USB-C plug exposed from said housing portion of said main housing, said housing portion of said main housing being formed with an engaging hole, said protecting cap being formed with an engaging hole, said engaging hole of said housing portion and said engaging hole of said protecting cap being adapted to be engaged with a flexible component such that said main housing and said protecting cap are connected thereby.

* * * * *